United States Patent [19]
Ishibashi et al.

[11] Patent Number: 5,176,782
[45] Date of Patent: Jan. 5, 1993

[54] APPARATUS FOR PHOTOCHEMICALLY ASHING A PHOTORESIST

[75] Inventors: Norio Ishibashi; Izumi Serizawa, both of Tokyo, Japan

[73] Assignee: ORC Manufacturing Company, Ltd., Tokyo, Japan

[21] Appl. No.: 802,658

[22] Filed: Dec. 9, 1991

[30] Foreign Application Priority Data

Dec. 27, 1990 [JP] Japan .................. 2-418605

[51] Int. Cl.⁵ .................. B44C 1/22; B29C 37/00
[52] U.S. Cl. .................. 156/345; 156/643; 156/646; 156/655; 156/668; 134/1
[58] Field of Search .......... 156/643, 646, 655, 635, 156/668, 345; 134/1, 31, 32, 33, 102

[56] References Cited

U.S. PATENT DOCUMENTS 4,885,047 12/1989 Ury et al. .................. 156/646 X
5,071,485 12/1991 Matthews et al. .................. 134/2

FOREIGN PATENT DOCUMENTS

1-84427 6/1989 Japan .
1-135732 9/1989 Japan .

Primary Examiner—William A. Powell
Attorney, Agent, or Firm—Longacre & White

[57] ABSTRACT

An apparatus for photochemically decomposing a photoresist is disclosed wherein processing time can be minimized by inducing a uniform photochemical oxidative decomposing reaction over the whole surface of a base board, and an ozone gas atmosphere can be utilized efficiently. The apparatus includes a rotatable circular table supporting one or more base boards and an ashing platform arranged around the periphery of the table including an ozone feeding slit and an ozone discharge slit. The apparatus also includes a plurality of ultraviolet ray lamps arranged inside a box-shaped vessel located above the ashing platform. An upper cover plate is pivotally mounted on the ashing platform and includes a transparent window plate through which the ultraviolet rays pass to irradiate the base boards. An airtight flat space is formed between the ashing platform and the upper cover to contain the ozone atmosphere.

2 Claims, 9 Drawing Sheets

APPARATUS FOR PHOTOCHEMICALLY ASHING A PHOTORESIST

BACKGROUND OF THE INVENTION

1. Field of the Invention

The present invention relates generally to an apparatus for photochemically ashing a photoresist. The apparatus is practically employed during one of a series of steps for forming semiconductor integrated circuits on base boards. More particularly, the present invention relates to an apparatus for photochemically ashing a photoresist wherein the apparatus induces uniform photochemical oxidation decomposition of the photoresist over the whole surface of each base board.

2. Description of Related Art

Figure 5:
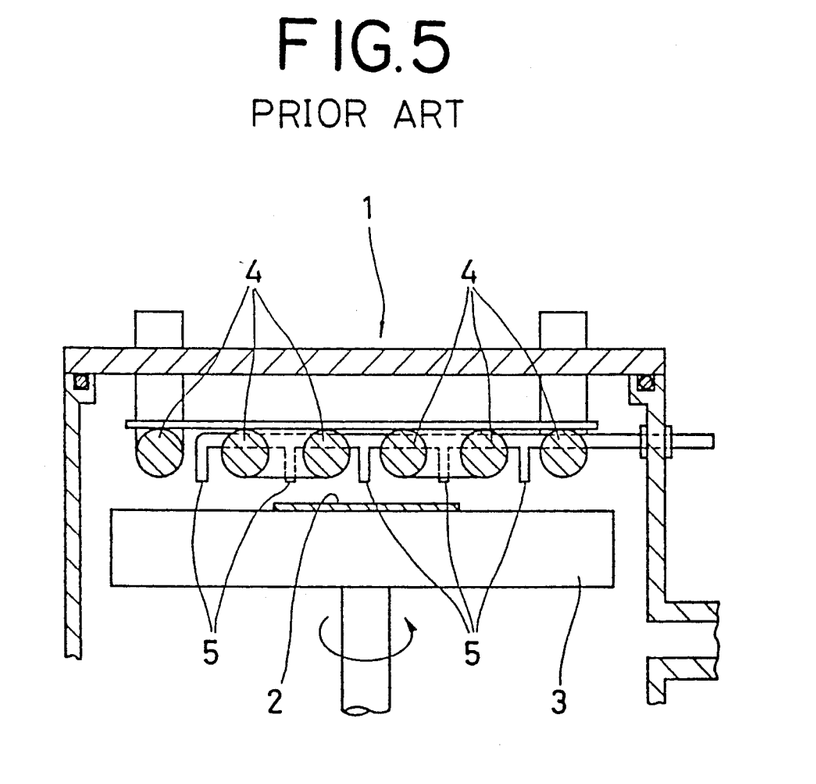
FIG. 5 is a fragmentary sectional elevation view of a conventional apparatus for photochemically ashing a photoresist.
Figure 6:
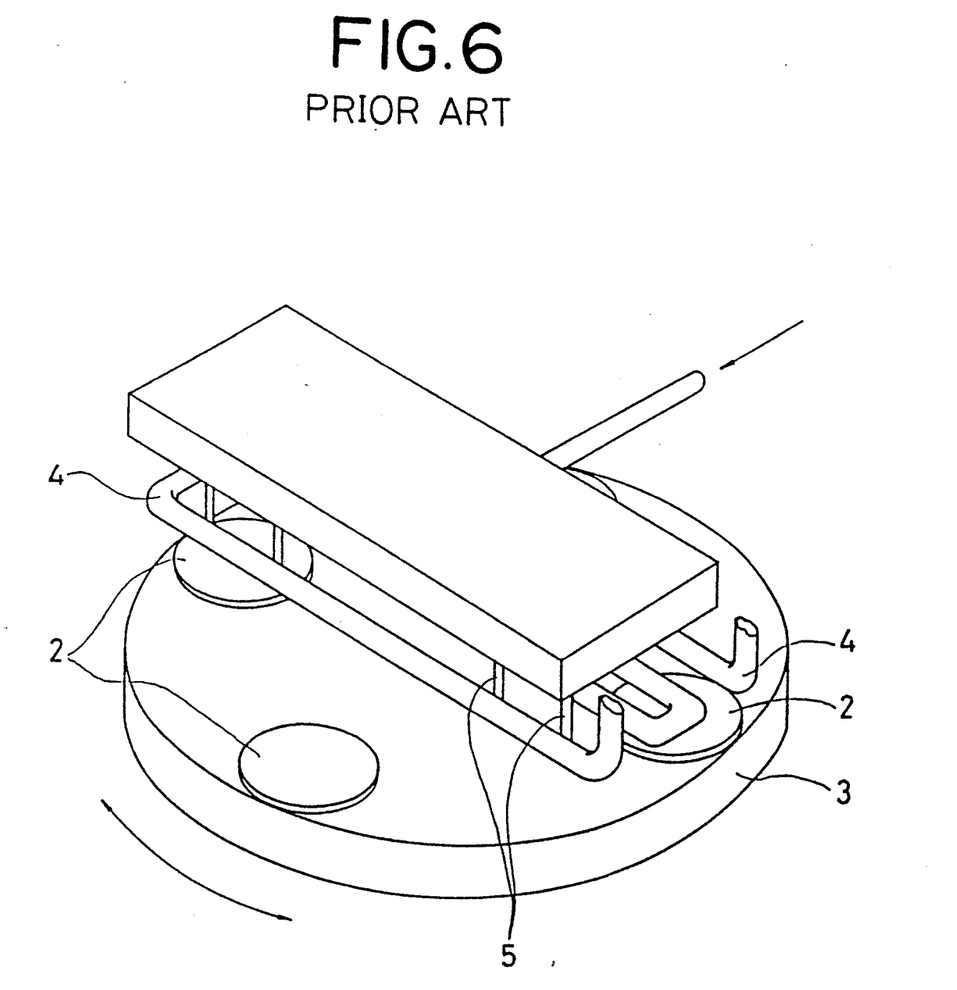
FIG. 6 is a perspective view of the conventional apparatus shown in FIG. 5.

To facilitate understanding of the present invention, a typical conventional apparatus for photochemically ashing a photoresist will be described. FIGS. 5 and 6 illustrate such a conventional apparatus as disclosed in Japanese Laid-Open Utility Model No. 84429/1989.

The conventional apparatus is essentially composed of a hollow chamber 1 which is exposed to the outside environment by an open bottom surface. A base board 2 (e.g. a silicon wafer) is held on a circular table 3 which is arranged to rotate in the interior of the chamber 1. Inside the chamber 1, a plurality of ultraviolet ray lamps 4 are arranged to irradiate the base board 2 and a plurality of ozone feeding nozzles 5 are directed at the base board 2 to provide ozone gas in the proximity of the base board 2. The ultraviolet ray lamps 4 of the conventional apparatus emit two different wavelengths of ultraviolet rays (i.e. 253.7 nm and 184.9 nm) in the presence of an oxygen radical which induces ashing of a photoresist on the base board 2.

A disadvantage of the conventional apparatus is that localized ashing of the photoresist occurs directly below the ozone feeding nozzles 5. The time required to accomplish ashing of the remaining part of the photoresist not directly under the ozone feeding nozzles 5 is considerably longer. Consequently, an extended period of time and an excessive quantity of ozone gas is required for completely ashing the whole base board 2.

Figure 7:
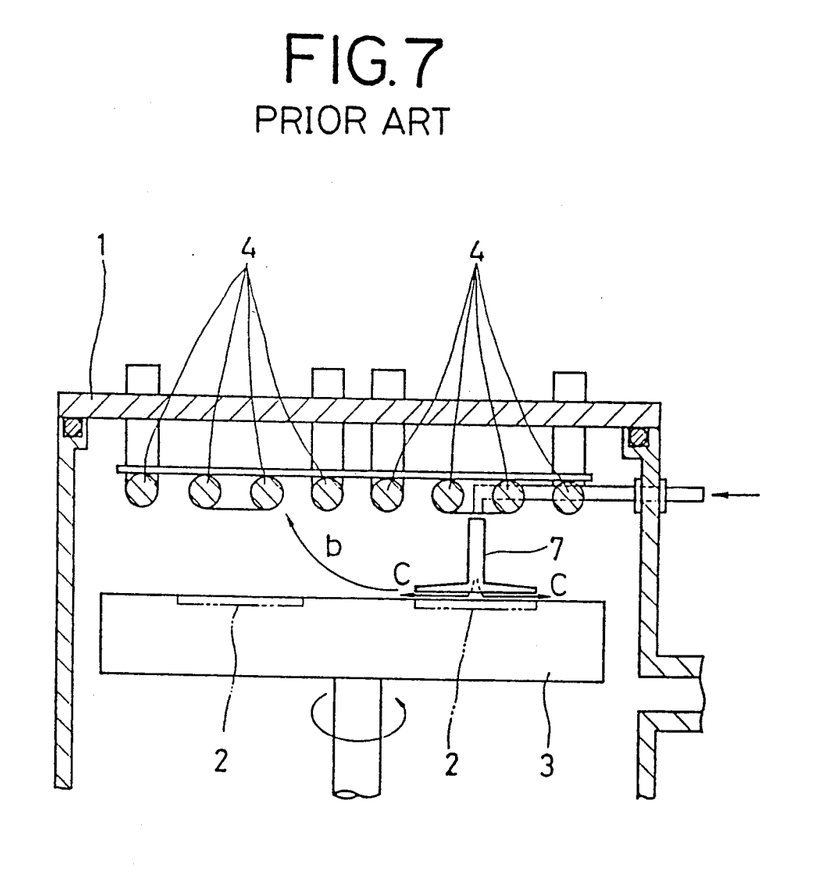
FIG. 7 is a fragmentary sectional elevation view of an improved conventional apparatus for photochemically ashing a photoresist.
Figure 8:
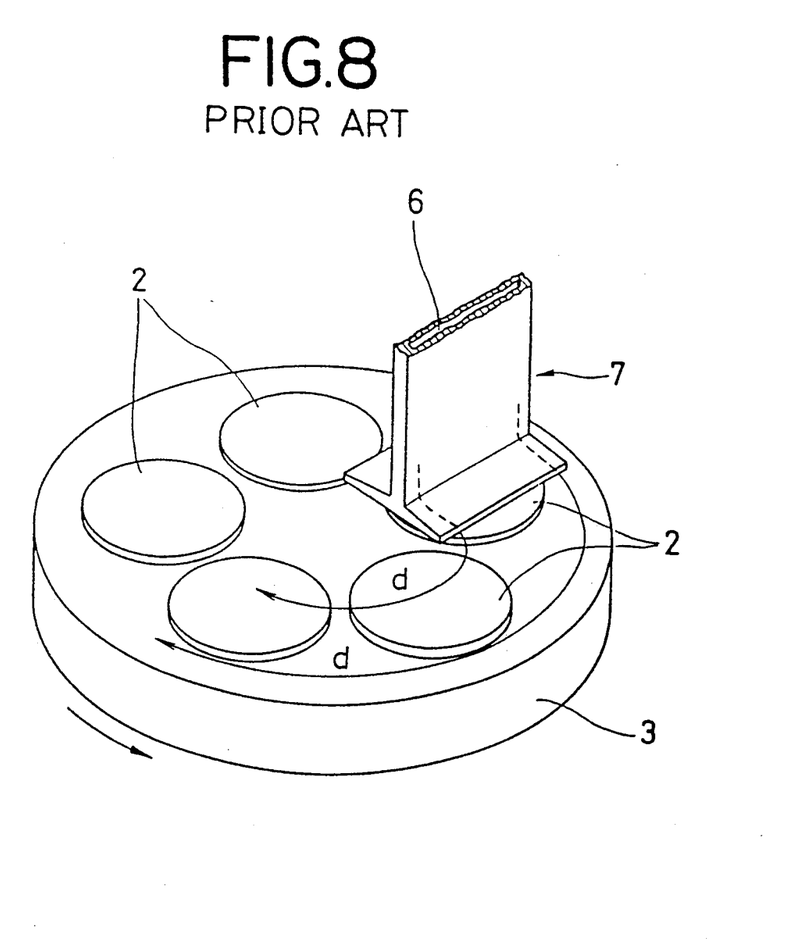
FIG. 8 is a perspective view of the improved conventional apparatus shown in FIG. 7.
Figure 9:
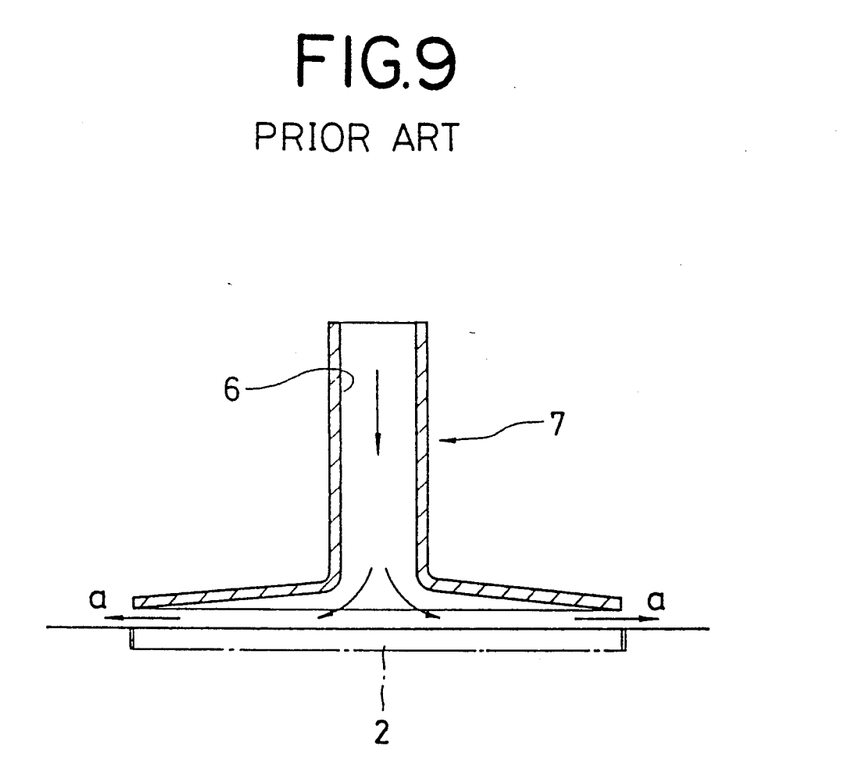
FIG. 9 is a sectional side view of an ozone feeding nozzle employed in the improved conventional apparatus shown in FIG. 7.

To obviate one disadvantage of the conventional apparatus, an improved conventional apparatus, shown in FIGS. 7 to 9, has been proposed by the applicant of the instant invention in Japanese Laid-Open Utility Model No. 135732/1989. As best shown in FIGS. 8 and 9, the improved conventional apparatus is characterized by an ozone feeding nozzle 7 including a slit-shaped passageway 6 flared at its end portion which is proximate to the upper surface of the base board 2. Ozone gas is supplied through the ozone feeding nozzle 7 and flows across the upper surface of the base board 2 in both a radial direction c (as shown in FIG. 7) and a circumferential direction d (as shown in FIG. 8). The improved apparatus provides a more uniform ashing than the conventional apparatus, however, excessive quantities of ozone gas are still required.

Specifically, it has been observed from operation of the improved conventional apparatus that the ozone gas is easily "peeled off" the upper surface of the base board 2 (as indicated by arrow b in FIG. 7) due to the presence of irregularities on the upper surface of the base board 2. Once peeled off, the ozone gas tends to be captured between the ultraviolet ray lamps 4 with little or no opportunity to repeatedly participate in the ashing. Consequently, an excessive quantity of ozone gas is consumed uselessly.

SUMMARY OF THE INVENTION

The present invention addresses the aforementioned problems inherent in these conventional apparatuses.

An object of the present invention is to provide an apparatus for photochemically ashing a photoresist wherein the apparatus assures that a photochemical ashing reaction is uniformly induced over the whole surface of a base board such as a silicon wafer of the like.

Another object of the present invention is to provide an apparatus for photochemically ashing a photoresist wherein the apparatus assures a minimal processing time and an economical use of ozone gas.

The present invention provides an apparatus for photochemically ashing a photoresist on the upper surface of a base board. Ashing occurs when the photoresist oxidation is decomposed by exposure to ultraviolet rays in an ozone gas atmosphere. The construction of the apparatus includes a rotatable circular table supporting one or more base boards and an ashing platform arranged around the periphery of the table including an ozone feeding slit and an ozone discharge slit. The slits are on opposite sides of the interposed table. The apparatus also includes a plurality of ultraviolet ray lamps arranged inside a box-shaped vessel located above the ashing platform. An upper cover plate is pivotally mounted on the ashing platform and includes a transparent window plate through which the ultraviolet rays pass from the box-shaped vessel to irradiate the base boards. When the upper cover is pivoted toward the ashing platform, it forms an airtight flat space between the ashing platform and the upper cover. The flat space also encompasses the ozone feeding and discharge slits. Additionally, ozone reservoirs may be associated with the ozone feeding and/or discharge slits.

Other objects, features and advantages of the present invention will become apparent from reading the following description which refers to the accompanying drawings.

BRIEF DESCRIPTION OF THE DRAWINGS

The present invention is illustrated by the following drawings in which.

DESCRIPTION OF THE PREFERRED EMBODIMENTS

The present invention will be described in detail hereinafter with reference to the accompanying drawings which illustrate preferred embodiments of the present invention.

Figure 1:
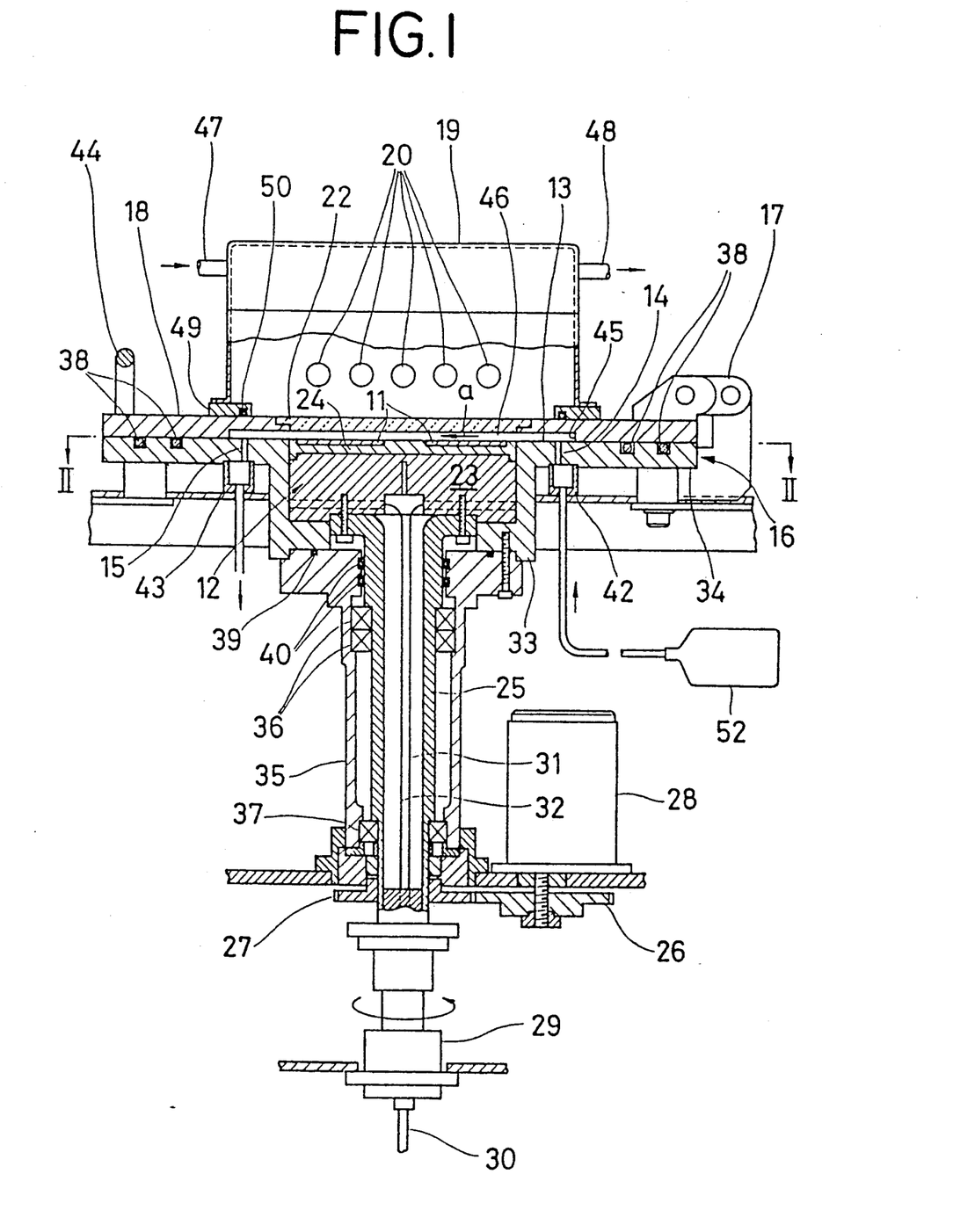
FIG. 1 is a sectional elevation view of an apparatus for photochemically ashing a photoresist in accordance with a first embodiment of the present invention.
Figure 2:
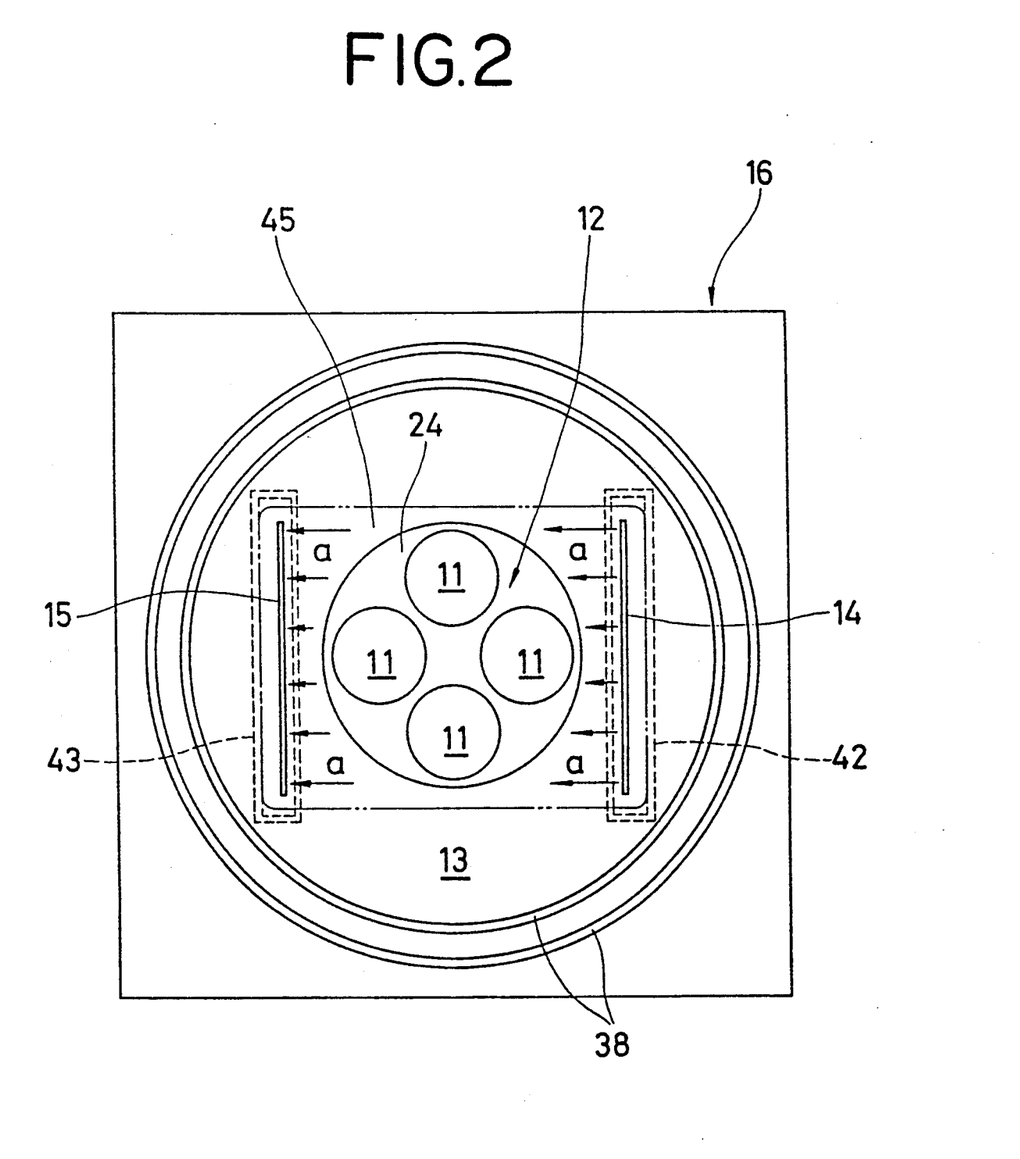
FIG. 2 is a plan view in accordance with the first embodiment of the apparatus as viewed from line II—II indicated in FIG. 1.

FIGS. 1 and 2 show an apparatus for photochemically ashing a photoresist in accordance with a first embodiment of the present invention. The apparatus for photochemically ashing a photoresist (hereinafter referred to simply as an ashing apparatus) in accordance with a first embodiment is comprised of a circular table 12 adapted to rotate in a horizontal plane with one or more base boards 11 placed thereon. An ashing platform 16 surrounds the periphery of the table 12 and includes an ozone feeding slit 14 and an ozone discharging slit 15 formed therein. An upper cover plate 18 is pivotally mounted on the ashing platform 16 via a hinge mechanism 17 so as to allow the upper surface of the ashing platform 16 to be exposed to the outside or airtightly isolated from the outside. As best shown in FIG. 1, a box-shaped vessel 19 is mounted on the upper cover plate 18 and encloses a plurality of ultraviolet ray lamps 20 arranged in horizontally spaced relationship. A window plate 22 molded of a transparent acrylic resin or a transparent quartz glass is laid in the upper cover plate 18 directly below the ultraviolet lamps 20.

The table 12 includes a main body 23 having electric heating wires (not shown) embedded therein and a circular plate-shaped tray 24. The main body 23 has a hollow driving shaft 25 concentrically fixed to the main body 23 for rotating the main body 23. The driving shaft 25 is driven via gears 26 and 27 by a motor 28 having a speed reduction unit attached thereto.

In addition, a rotary type electrical connector 29 is secured to the lowermost end of the driving shaft 25 so as to allow electricity to be fed to the electric heating wires (not shown) for the base boards 11. The input side of the connector 29 is connected to a feeder line 30, while the output side of the connector 29 is connected to lead wires 31 and 32. The lead wires 31 and 32 extend through the hollow space of the driving shaft 25 to the electric heating wires (not shown). Since a number of known conventional rotary type connectors 29 are commercially available, a detailed description on the connector 29 is not necessary.

The ashing platform 16 comprises a cup-shaped portion 33 having a cavity formed therein to receive the table 12. The ashing platform further comprises a circular plate-shaped portion 34 formed integrally with the cup-shaped portion 33 and a cylindrical portion 35 fixed to the bottom surface of the cup-shaped portion 33. The driving shaft 25 is rotatably supported in the interior of the cylindrical portion 35 by bearings 36 and 37. In FIG. 1, reference numerals 38, 39 and 40 designate sealing means (e.g. O-rings) which prevent ozone gas from leaking outside of the ashing apparatus.

The ozone feeding slit 14 and ozone discharging slit 15 are symmetrically arranged with the table 12 interposed therebetween. Additionally, both slits 14 and 15 extend through the circular plate-shaped portion 34 so that they are in fluid communication with ozone reservoirs 42 and 43, respectively.

According to the first embodiment of the present invention, the opening of the slit 14 and the opening of the slit 15 are rectilinear and parallel with one another, as shown in FIG. 2. However, the present invention is not limited to the aforementioned rectilinear arrangement. Alternatively, the opening of the slit 14 and the opening of the slit 15 may be arc-shaped and arranged symmetrically with respect to the center of the ashing platform 16 which coincides with the axis of the driving shaft 25.

A handle 44 is attached to the upper cover plate 18 on the opposite side of the hinge mechanism 17 to facilitate pivotally opening and closing the upper cover plate 18. A rectangular shallow cavity 45 is formed in a central part of the bottom side of the upper cover plate 18. The cavity 45 forms a flat space 46, which is airtight when the upper cover plate 18 is pivoted onto the ashing platform 16 and a tightening unit (not shown) is actuated. The flat space 46, delineated by the double dot chain lines in FIG. 2, encompasses the openings of slits 14 and 15 as well as the upper surface of the table 12.

A nitrogen gas feeding pipe 47 and a nitrogen gas discharging pipe 48 are connected to the vessel 19 in order to cool the ultraviolet ray lamps 20. A seal packing 50 seals a flange 49 of the vessel 19 on the upper cover plate 18.

The operation of the ashing apparatus in accordance with the first embodiment of the present invention will now be described.

First, one or more base boards 11 are placed on the tray 24 which has been previously mounted on the table 12. The upper cover plate 18 is pivoted about the hinge mechanism 17 into close contact with the upper surface of the ashing platform 16, thereby forming the flat space 46. Subsequently, the motor 28 rotationally drives the table 12 at a constant speed, and the ultraviolet ray lamps 20 are turned on as ozone gas is fed from an ozone gas supply source 52 through the ozone reservoir 42 and the ozone feeding slit 14 into the flat space 46. The ozone gas flows across the upper surfaces of each of the base boards 11 in the direction indicated by the arrows a, whereby a photoresist (not shown) on the upper surface of the base boards is photochemically decomposed. Specifically, the ozone gas atmosphere in cooperation with the ultraviolet rays irradiated from the ultraviolet ray lamps 20 react with the photoresist causing photochemical oxidation decomposition. While the photoresist is photochemically decomposed, the used ozone gas is discharged to the outside via the ozone discharging slit 15 and the ozone reservoir 43.

Since the pressure of the ozone gas to be blown into the flat space 46 is uniformly maintained by the ozone reservoir 42 on the feed side, and moreover the slits 14 and 15 are symmetrically arranged with the table 12 interposed therebetween, the ozone gas flows in the flat space 46 uniformly and the photochemical ashing reaction uniformly takes place with the photoresist. Peeling off of the ozone gas from the upper surface of the base boards 11 still occurs, however the ozone gas collides against the ceiling of the cavity 45, i.e. the window plate 22, and flows back down to repeatedly participate in the photochemical oxidative decomposition of the photoresist. The effective utilization of the ozone gas is substantially improved with reduced consumption of the ozone gas.

Figure 3:
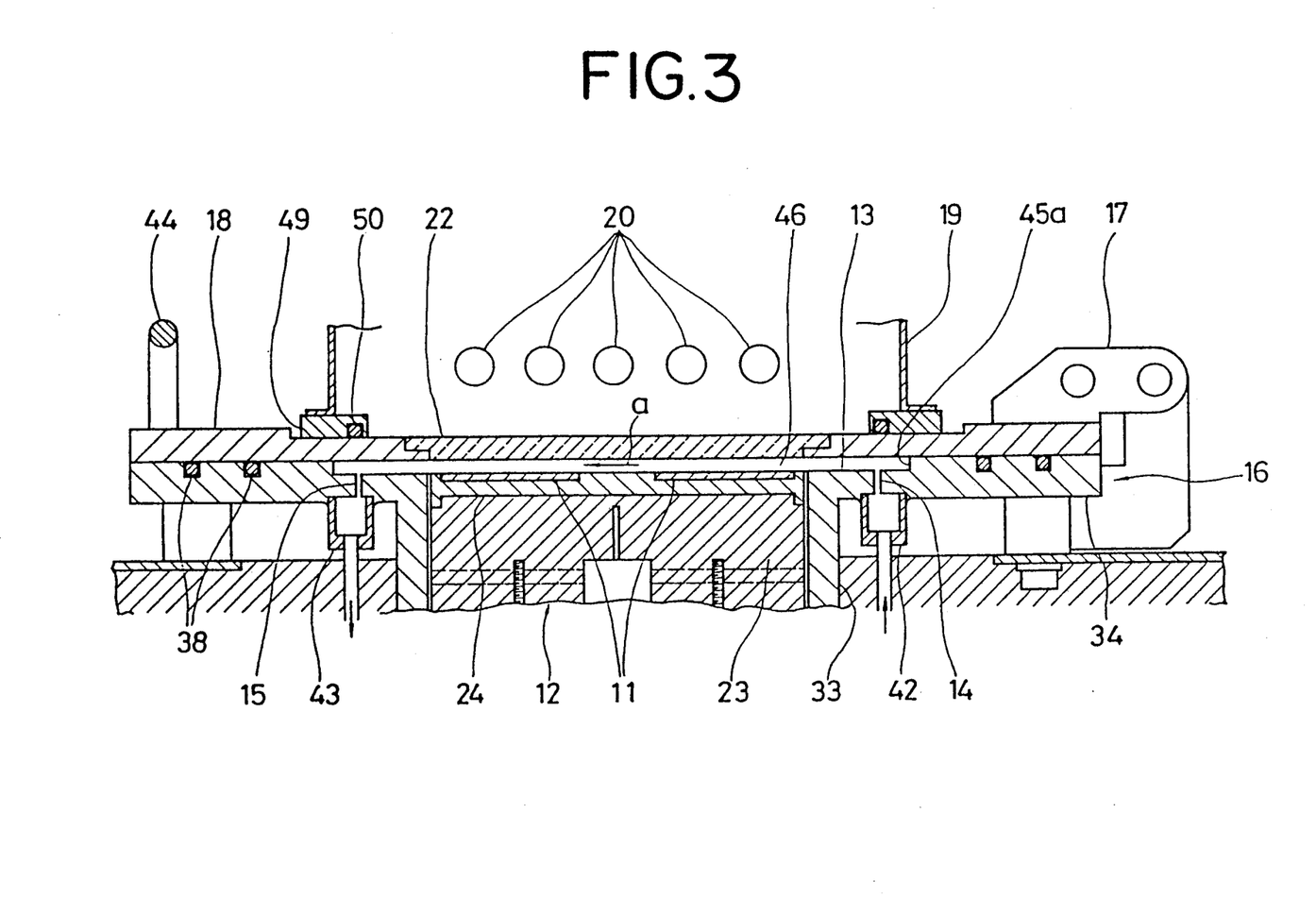
FIG. 3 is a fragmentary sectional elevation view of an apparatus for photochemically ashing a photoresist in accordance with a second embodiment of the present invention.

An ashing apparatus in accordance with a second embodiment of the present invention will be described below with referenced to FIG. 3.

According to the second embodiment of the present invention, no cavity is formed in the upper cover plate 18, instead, a cavity 45a having the same contour as that in the preceding embodiment is formed in the upper surface of the ashing platform 16. The ashing apparatus in accordance with the second embodiment of the present invention is essentially the same as that of the first embodiment with the exception that the flat space 46 is incorporated into the ashing platform 16.

Figure 4:
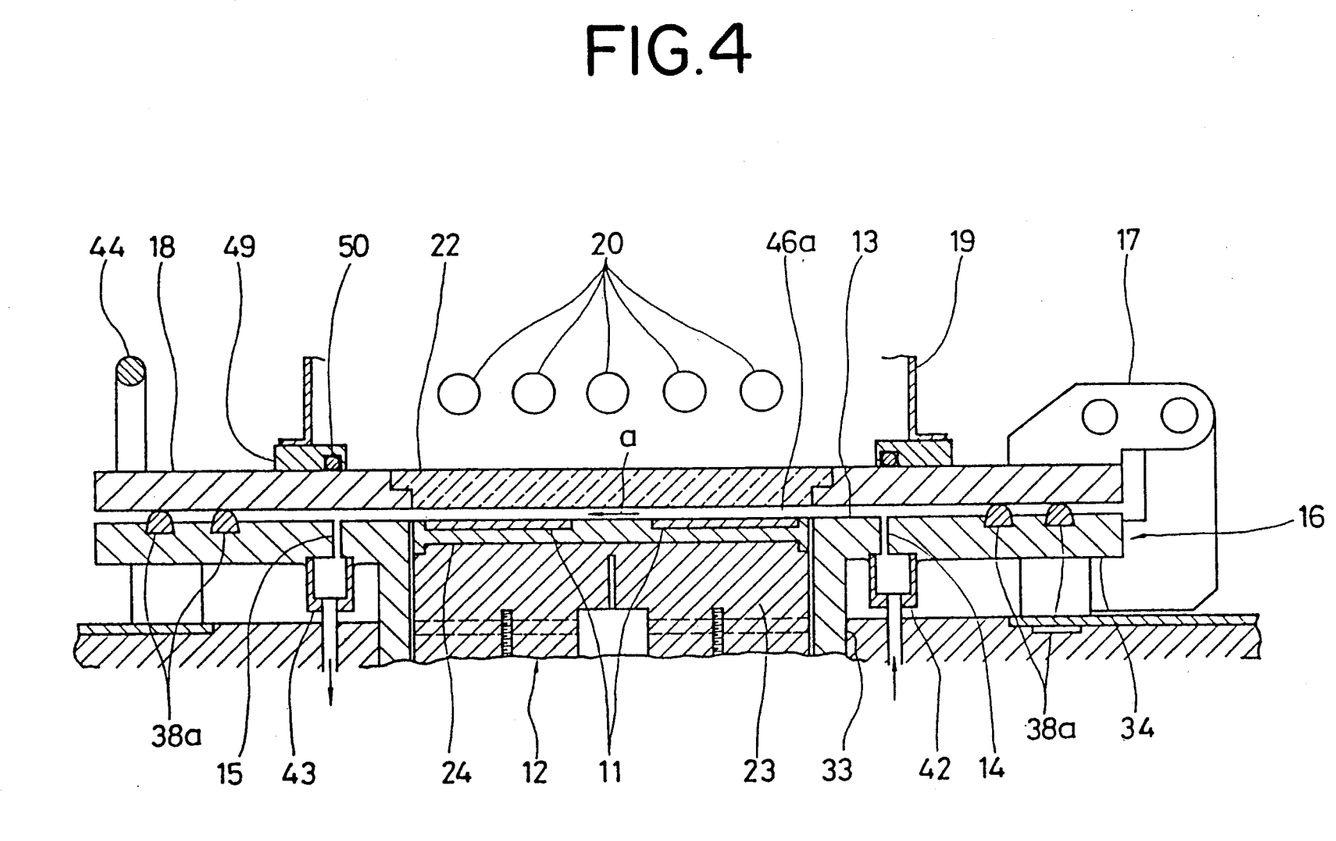
FIG. 4 is a fragmentary sectional elevation view of an apparatus for photochemically ashing a photoresist in accordance with a third embodiment of the present invention.

An ashing apparatus in accordance with a third embodiment of the present invention will be described below with reference to FIG. 4.

According to the third embodiment of the present invention, no cavity is formed in either the ashing platform 16 or the upper cover pate 18, instead, a flat space 46a is formed between the ashing platform 16, the upper cover plate 18 and seal rings 38a arranged between the ashing platform 16 and the upper cover plate 18. The ashing apparatus in accordance with the third embodiment of the present invention is essentially the same as that of the preceding embodiments with the exception that the flat space 46a is incorporated between the ashing platform 16 and the upper cover plate 18.

With the ashing apparatus of the present invention constructed according to any of the above-described embodiments, the following advantageous effects are obtainable.

Because ozone gas is uniformly fed from the ozone feeding slit 14, across the table 12 and into the ozone discharging slit 15, it is possible to induce uniform photochemical oxidation decomposition over the whole surface of each of the base boards in a minimal processing time. Because the base boards 11 are processed within the small volume of a flat space 46, the quantity of the ozone gas consumed in the process can be reduced substantially.

In addition, since the arrangement of an ozone reservoir 42 on the feed side makes possible a substantially uniform flow of the ozone gas into the flat space 46, a uniform photochemical oxidative decomposing reaction can be induced more reliably.

While the present invention has been described above with respect to a few preferred embodiments, it should of course be understood that the present invention is not limited to these embodiments. Various changes or modifications may be made without departure from the scope of the invention defined by the appended claims.

What is claimed is:

1. An apparatus for photochemically ashing a photoresist wherein said photoresist on an upper surface of a base board experiences photochemical oxidation decomposition as a result of ultraviolet ray irradiation in an ozone atmosphere, said apparatus comprising:
   a circular table adapted for rotation in a horizontal plane and supporting said base board;
   an ashing platform arranged around the periphery of said table and lying in said horizontal plane, said ashing platform including an ozone feeding slit and an ozone discharging slit, wherein said ozone feeding slit and said ozone discharging slit are arranged on opposite sides of said table which is interposed therebetween;
   a plurality of ultraviolet ray lamps adapted to irradiate said base board and arranged inside a box-shaped vessel; and
   an upper cover plate pivotally mounted on said ashing platform and including a transparent window adapted to transmit said irradiation, said upper cover plate adapted to be displaced away from said ashing platform whereby said base board is accessed and displaced toward said ashing platform whereby an airtight flat space containing said base board is formed;
   wherein said flat space is in fluid communication with said ozone feeding slit and said ozone discharging slit, and said flat space is adapted to contain said ozone atmosphere.

2. The apparatus according to claim 1, further comprising an ozone reservoir in fluid communication with said flat space through said ozone feeding slit.

* * * * *